United States Patent
Mei et al.

(10) Patent No.: US 9,947,611 B2
(45) Date of Patent: Apr. 17, 2018

(54) THROUGH HOLE ARRAYS FOR FLEXIBLE LAYER INTERCONNECTS

(71) Applicant: Palo Alto Research Center Incorporated, Palo Alto, CA (US)

(72) Inventors: Ping Mei, San Jose, CA (US); Brent S. Krusor, Fremont, CA (US); David K. Biegelsen, Portola Valley, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 12 days.

(21) Appl. No.: 15/010,279

(22) Filed: Jan. 29, 2016

(65) Prior Publication Data
US 2017/0221795 A1   Aug. 3, 2017

(51) Int. Cl.
*H01L 23/48* (2006.01)
*H01L 23/52* (2006.01)
*H01L 29/40* (2006.01)
*H01L 21/768* (2006.01)

(52) U.S. Cl.
CPC ...... *H01L 23/481* (2013.01); *H01L 21/76898* (2013.01)

(58) Field of Classification Search
CPC ............. H01L 23/481; H01L 21/76898; H01L 23/49816; H01L 23/3171; H01L 21/486; H01L 23/49838; H01L 23/49827; H01L 21/565; H01L 21/4853
See application file for complete search history.

(56) References Cited

U.S. PATENT DOCUMENTS

| | | | | |
|---|---|---|---|---|
| 4,000,045 A | * | 12/1976 | Rotzow | H05K 3/242 205/125 |
| 2006/0065965 A1 | * | 3/2006 | Ohsaka | H01L 23/49838 257/690 |
| 2008/0173474 A1 | * | 7/2008 | Ta | H05K 1/0287 174/266 |
| 2011/0033976 A1 | * | 2/2011 | Di Cioccio | H01L 24/24 438/107 |
| 2011/0253795 A1 | * | 10/2011 | Kato | G06K 19/07749 235/492 |
| 2012/0273960 A1 | * | 11/2012 | Park | H01L 21/4846 257/774 |
| 2013/0075936 A1 | * | 3/2013 | Lin | H01L 24/19 257/777 |
| 2014/0353823 A1 | * | 12/2014 | Park | H01L 23/3128 257/737 |

OTHER PUBLICATIONS

Christenson, et al., "Direct Printing of Circuit Boards Using Aerosol Jet", NIP27 and Digital Fabrication 2011, Technical Program and Proceedings, pp. 433-436.

* cited by examiner

*Primary Examiner* — Thanh Y Tran
(74) *Attorney, Agent, or Firm* — Fay Sharpe LLP

(57) ABSTRACT

Disclosed is an integrated circuit arrangement including a two sided circuit board, having a first surface and a second surface. A plurality of electrical conductors is incorporated as part of the two sided circuit board. An array of through holes extend through the first surface and the second surface, arranged in a pattern and are configured to provide a common electrical connection area, wherein the common electrical connection area is associated with a portion of a particular one of the plurality of electrical conductors.

19 Claims, 8 Drawing Sheets

$\alpha\ f(d, SURFACE\ TENSION, WETTING, VISCOSITY)$

THROUGH HOLE ARRAYS FOR FLEXIBLE LAYER INTERCONNECTS

BACKGROUND

The present application is directed to the mechanical and electrical arts, and more particularly to interconnections for integrated circuits.

The present application provides additional methods and designs for improved interconnects for integrated circuits, as well as for other uses.

BRIEF DESCRIPTION

Disclosed is an integrated circuit arrangement including a two sided circuit board, having a first surface and a second surface. A plurality of electrical conductors is incorporated as part of the two sided circuit board. An array of through holes extend through the first surface and the second surface, arranged in a pattern and are configured to provide a common electrical connection area, wherein the common electrical connection area is associated with a portion of a particular one of the plurality of electrical conductors.

The integrated circuit further includes a second array of through holes arranged in a pattern and configured to provide a second common electrical connection area, wherein the second common electrical connection area is associated with another portion of the particular one of the plurality of electrical conductors.

In the integrated circuit the array of through holes are filled with a conductive material.

In the integrated circuit the through holes of the array are of a same diameter.

In the integrated circuit at least one of the through holes of the array is of a diameter different than other through holes of the array.

In the integrated circuit at least one of the through holes of at least one of the first array and the second array is of a diameter different than other through holes of the array and the second array.

In the integrated circuit the two sided circuit board includes a hydrophilic substrate and a hydrophobic area located on one of the first side and the second side of the two-sided circuit board.

In the integrated circuit the hydrophobic area is one of a hydrophobic layer and at least one hydrophobic dot corresponding to the through holes.

Also disclosed is an integrated circuit including a two sided circuit board having a first surface and a second surface. A plurality of electrical conductors is incorporated as part of the two sided circuit board. A first array of through holes extend through the first surface and the second surface, the first array of through holes arranged in a pattern and configured to provide a first electrical connection area. A second array of through holes extend through the first surface and the second surface, the second array of through holes arranged in a pattern and configured to provide a second electrical connection area. A crossover structure is electrically connected to the first array of through holes and the second array of through holes, on one of the first side and the second side of the circuit board.

In the integrated circuit the array of through holes are filled with a conductive material.

In the integrated circuit the through holes of the first and the second array are each of a same diameter.

In the integrated circuit at least one of the through holes of the first and second array is of a diameter different than other through holes of the first and second array.

In the integrated circuit the through holes of the array are filled with a conductive material from the first side and the second side.

In the integrated circuit the two sided circuit board includes a hydrophilic substrate and a hydrophobic area located on one of the first side and the second side of the two-sided circuit board.

In the integrated circuit the hydrophobic area is one of a hydrophobic layer and at least on hydrophobic dot corresponding to the through holes.

A method of configuring a two sided circuit board having a first surface and a second surface, includes generating a first array of through holes which extend through the first surface and the second surface, arranged in a pattern and configured to provide a first common electrical connection area. Generating a second array of through holes which extend through the first surface and the second surface, arranged in a pattern and configured to provide a second common electrical connection area. Incorporating a conductive material into the first array of through holes and the second array of through holes sufficient to provide conductive paths within the through holes from the first surface to the second surface. The first and second common electrical connection areas being associated with an electrical conductor acting as a crossover structure.

The method further includes filling the through holes of the array with a conductive material from the first side and the second side.

The method further including providing the two sided circuit board with a hydrophilic substrate and a hydrophobic area located on one of the first side and the second side of the two-sided circuit board.

The method including the hydrophobic area being one of a hydrophobic layer and at least one hydrophobic dot corresponding to the through holes.

DETAILED DESCRIPTION

The present disclosure describes structures, methods and applications of making conductive through hole connections in a substrate including but not limited to plastic substrate arrangements, and which employ the use of printing technology.

In typical printed circuit board (PCB) layouts a crossover connection is a common element used to address configurations where conductive traces on the surface of the printed circuit board would cross each other's paths leading to undesirable electrical shorts. One conventional manner of avoiding this situation is to use printed circuit boards having through holes with copper plated sidewalls to connect the inner layer circuits together and bring the circuit to the printed circuit board surface where connectors or components are placed to provide final functionality. However, this requires a complex construction of the printed circuit board by requiring the plating of the inner walls of the through holes with the copper cladding, also such printed circuit board designs are known to employ non-flexible substrates.

Figure 1:
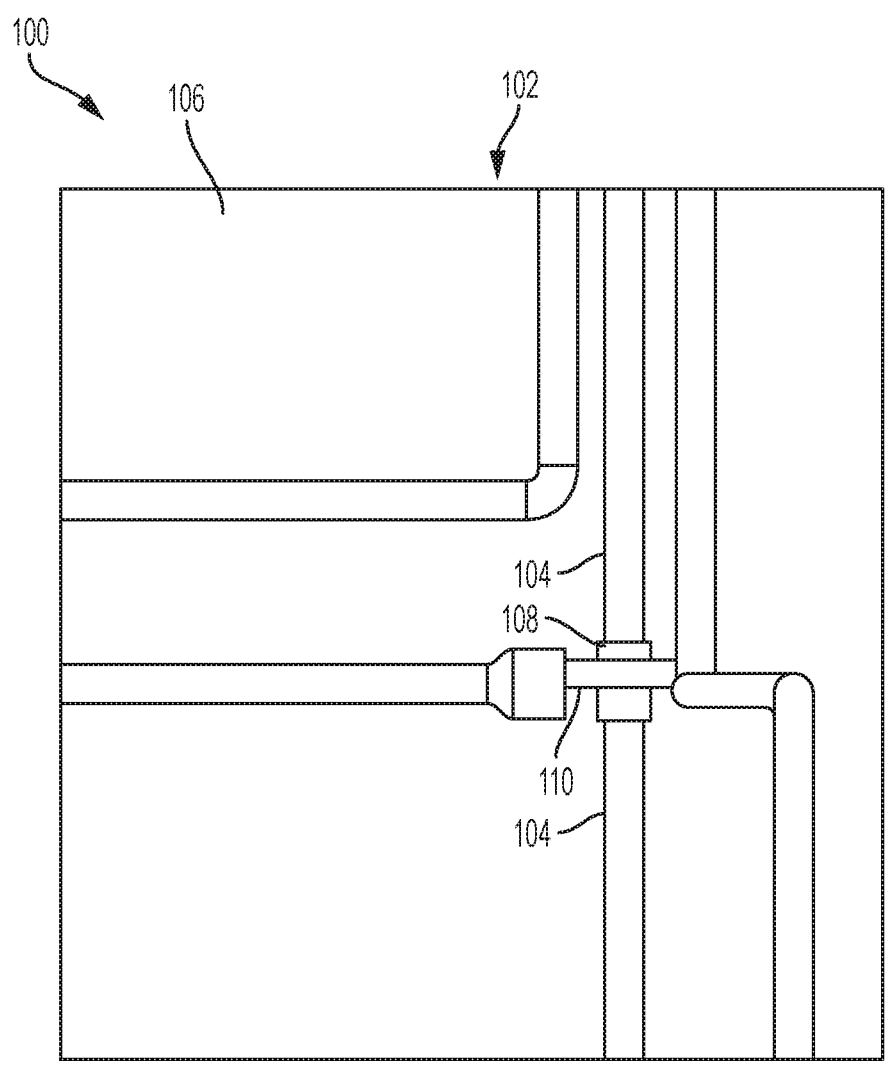
FIG. 1 depicts a prior art conductive crossover or interconnect circuit.

Another possible solution for both rigid printed circuit boards and flexible printed circuit boards, is shown in arrangement 100 of FIG. 1 which depicts a portion of a flexible substrate (i.e., a flexible printed circuit board) 102, having a printed first conductive trace 104 located on an upper surface 106 of the substrate 102. A printed insulating material 108 covers a portion of the first conductive trace 104. The insulating material 108 is formed of an electric insulating material. Further shown in FIG. 1 is another conductive trace 110 printed over the insulating material 108. Thus, the insulating material 108 is formed on the same side as the conductive traces of the printed circuit board. In this example the conductive traces maybe formed of silver (Ag) or other material with appropriate conducive characteristics.

The configuration of FIG. 1 requires precise placement of the insulating material in relation to the conductive traces. Further over time portion of the insulating material 108 may wear away resulting in a shorting between the conductive traces.

The following describes arrangements, methods and applications which employ through hole connections on a flexible substrate (e.g., plastic or other appropriate material) by creating through holes and printing conductive connections into the through holes. While there may be existing systems that use through hole conductive connections between a top surface and a second surface of a printed circuit board, commonly what is occurring is a through hole is drilled through the printed circuit board, then a conductive material (e.g., a conductive ink or paste) is printed into the through hole, and before the conductive material dries, a vacuum is used to move the conductive material along the inner length of the through hole, which after sintering becomes the front and back side connections through the printed circuit board.

Turning more particularly to the present application, the crossover structure employed herein is on side opposite the conductive traces of the two-sided circuit board that are desired not to be shorted.

Figure 2A:
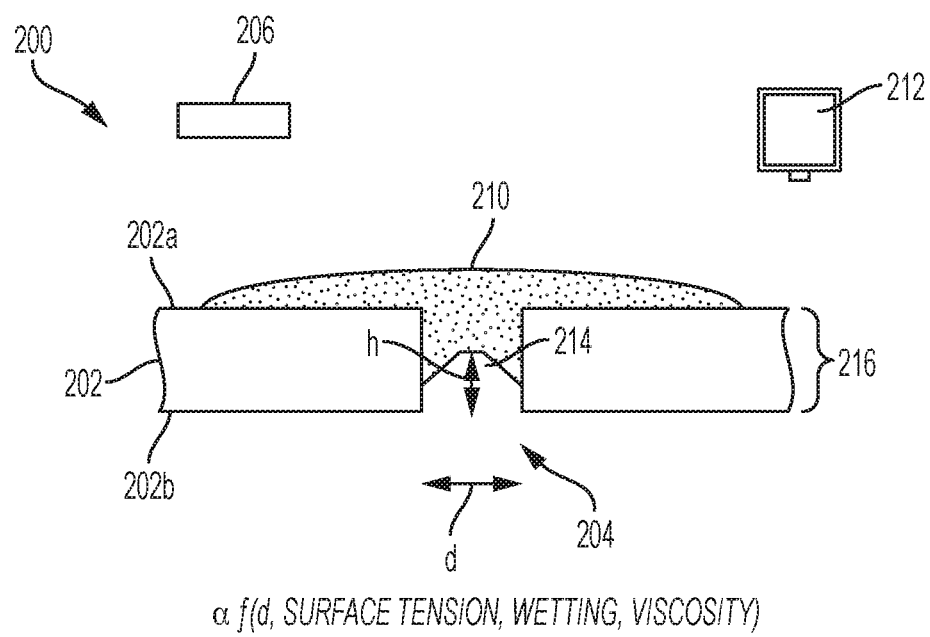
FIG. 2A depicts a through hole with printed conductive material according to the present application.

With attention to arrangement 200 of FIG. 2A, a portion of two-sided circuit board 202 is shown in a side view having a first or upper surface 202a and a second or lower surface 202b. A through hole 204 has been laser drilled or otherwise manufactured by use of drilling device 206. The through hole 204 extends from the first or upper surface 202a to the second or bottom surface 202b. Thereafter, a conductive material, such as a conductive ink or paste or other appropriate material 210 is printed on the first or upper surface 202a, by a printer arrangement 212. It is to be appreciated that either surface could be printed initially. In this embodiment, surface tension of the conductive material 210 within through hole 204 is employed to maintain the conductive material 210 within the interior, such that it does not pass out of through hole 204. It is understood that surface tension ($\gamma$) is the magnitude (F) of the force exerted parallel to the surface of the liquid divided by the length (L) of the line over which the force acts:

$$\gamma = F/L$$

In addition, non-Newtonian behavior of the ink such as apparent viscosity increases with duration of stress and may affect the filling of the ink into the hole. Thus properties (e.g., surface tension, wetting, viscosity) of the conductive material 210, along with the size of the through hole(s) (i.e., the diameter) 204, are used to construct through hole(s) which maintain the conductive material 210 within the through hole(s) 204. The distance of an open area of through holes (i.e., the area in the through hole free of the conductive material) being found by the formula:

$$h \propto f(d, \text{surface tension}, \text{wetting}, \text{viscosity}),$$

where h equals the open area from the second or bottom surface 202b of the through hole 204 to a peak height 214 of the open area, and d being the diameter of the through hole 204.

The thickness 216 of substrate 202, along with the amount of conductive material will also be taken into consideration.

Figure 2B:
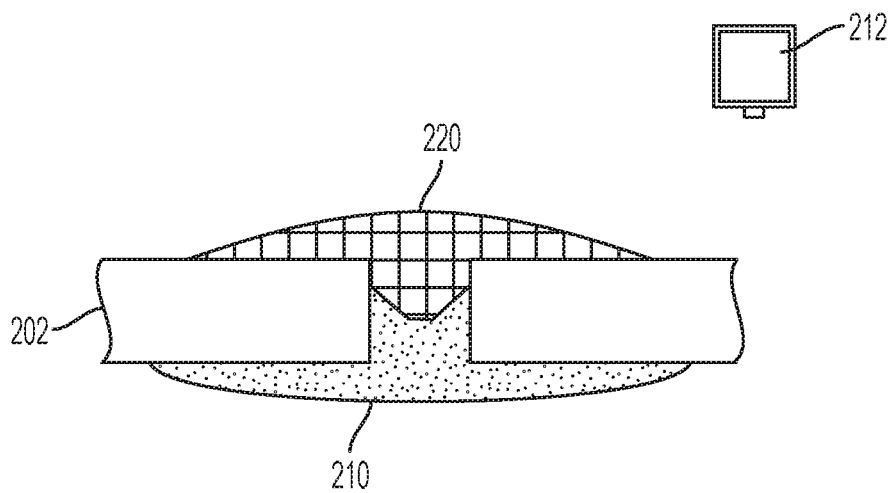
FIG. 2B shows a printed conductive material formed on a second surface.

Thereafter, as will be understood by viewing FIG. 2B, once printing of the conductive material 210 has taken place on one side of substrate 202 (and the conductive material has cured or otherwise solidified to an appropriate degree), the substrate 202 is rotated and similar operations are performed. More particularly conductive material 220 (this may be the same conductive material as conductive material 210), is printed into the though hole 204 from second or back side surface 202b. A sufficient amount of the conductive material 220 is printed such that the portions of conductive materials 210 and 220 meet filling the though hole to provide a conductive path from the first or upper side surface 202a to the second or back side surface 202b.

By this arrangement, there is no need to provide a vacuum to pull conductive material through the through hole.

It has been understood that providing a sufficient surface tension, such that the conductive material 210 and 220 stays within the through hole 204, requires that the through holes themselves may be of quite a small diameter. Whereby in certain implementations a single through hole will not provide a sufficient conductivity.

Figure 3A:
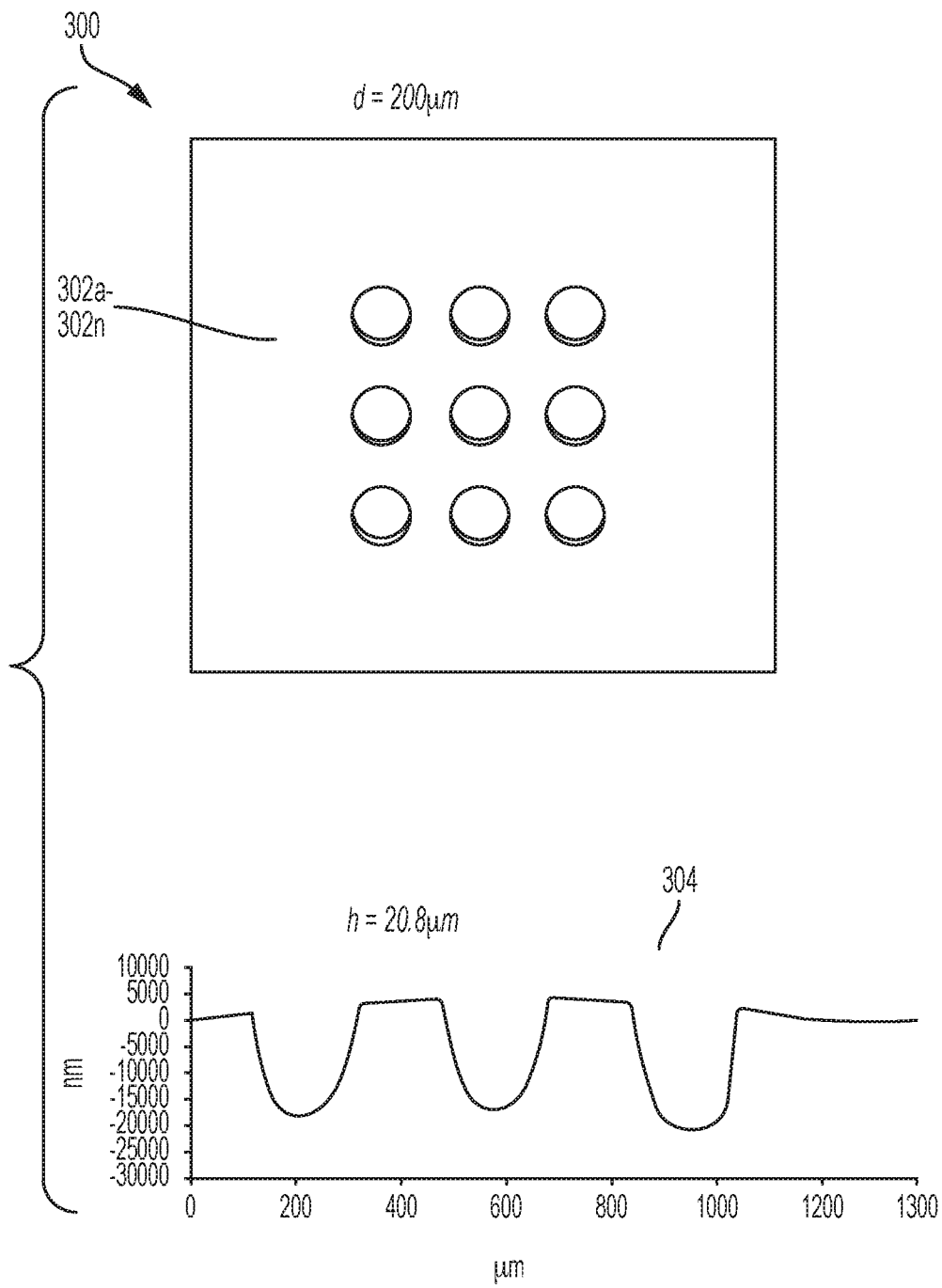
FIG. 3A depicts a portion of a printed circuit board having an array of through holes according to the present application, and a chart describing a height of an open area without the conductive material for a 200 micron diameter through hole array.

Attention is therefore directed to FIG. 3A which illustrates a portion of a two-sided circuit board (flexible substrate) 300 according to the present application. Incorporated into circuit board portion 300 is an array of individual through holes 302a-302n, formed in a 3-by-3 pattern as a common electrical connection area. In FIG. 3A, the diameter of each of the through holes are the same (e.g., 200 microns), and the thickness of the two-sided circuit board 300 is 150 microns.

With continuing attention to FIG. 3A, it shows an example of printing about ~10 μm thick silver paste (DGP-NO nanoparticle silver paste from Advanced Nano Products)

on a PEN substrate(Polyethylene naphthalate) which is 150 microns thick, and through holes having 200 micron diameters, when the conductive material is printed into through holes on one side of the substrate 300, a portion of the through holes are filled with the conductive material, but the conductive material does not completely fill the through holes. Rather, there is an open area or space of approximately 20.8 microns from the second or bottom surface (e.g., 202*b* of FIG. 2A) to a peak open area (e.g., 214 of FIG. 2). Chart 304 of FIG. 3A shows the approximately ("h") 20.8 micron levels achieved with the 200 micron diameter through holes.

Figure 3B:
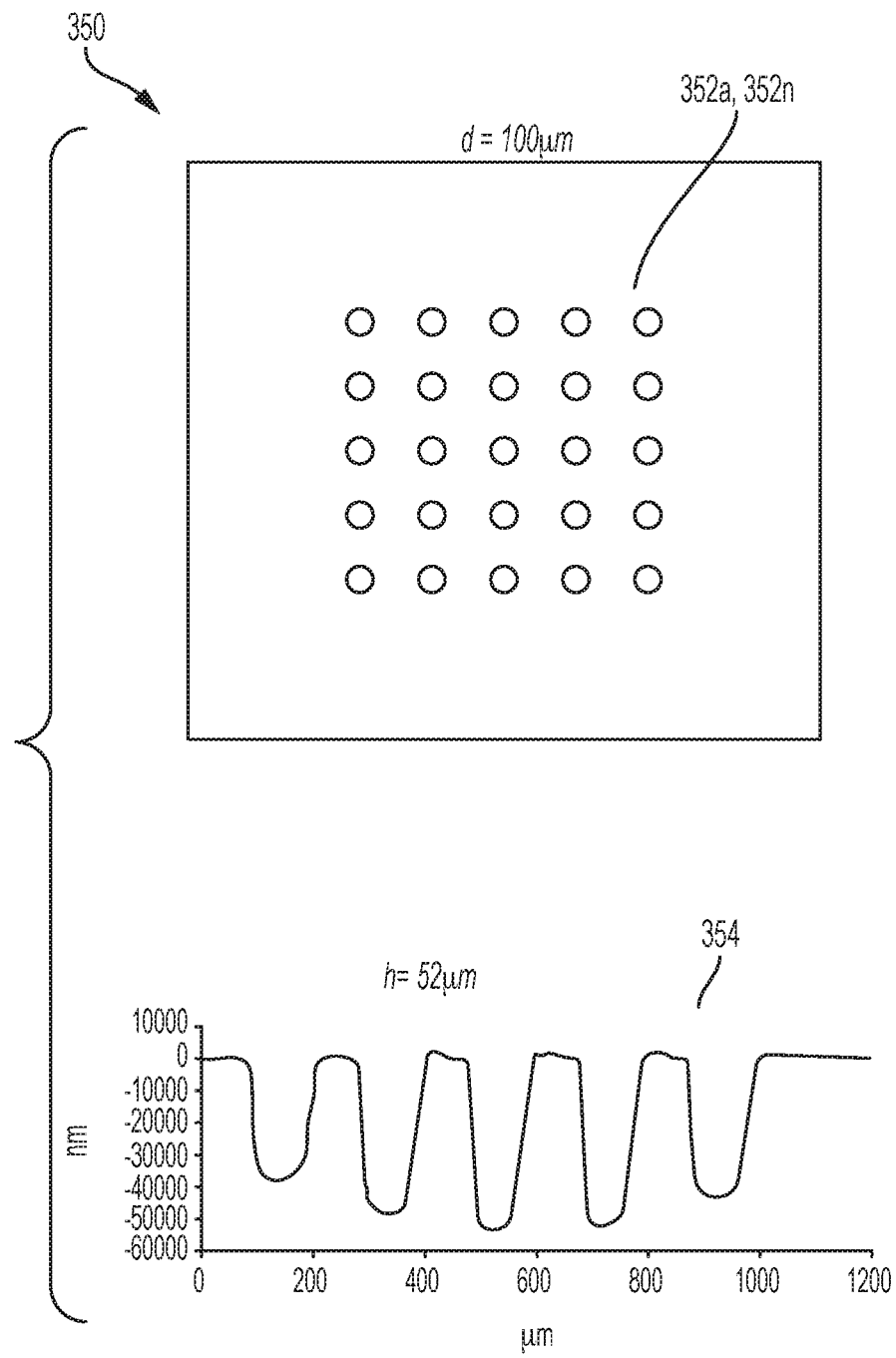
FIG. 3B depicts a portion of a printed circuit board having an array of through holes according to the present application, and a chart describing a height of an open area without the conductive material for a 200 micron diameter through hole array.

Turning to FIG. 3B, illustrated is a portion of a two sided circuit board (flexible substrate) 350 having an array of through holes (a 5-by-5 array) 352*a*-352*n*, as a common electrical connection area. In this arrangement, using a same conductive material as the conductive material of FIG. 3A, with through holes having a diameter of 100 microns, and again for a circuit board 150 microns thick, the open height ("h") is determined to be approximately 52 microns, as also shown in chart 354. It is appreciated since the through holes are smaller in the FIG. 3B array 350, the smaller holes prevent fast ink filling in this case so the open height ("h") distance is greater than in FIG. 3A.

FIGS. 3A and 3B, illustrate that keeping other parameters equal, larger diameter through hole result in the conductive material filling the through hole to a greater depth.

Figure 4:
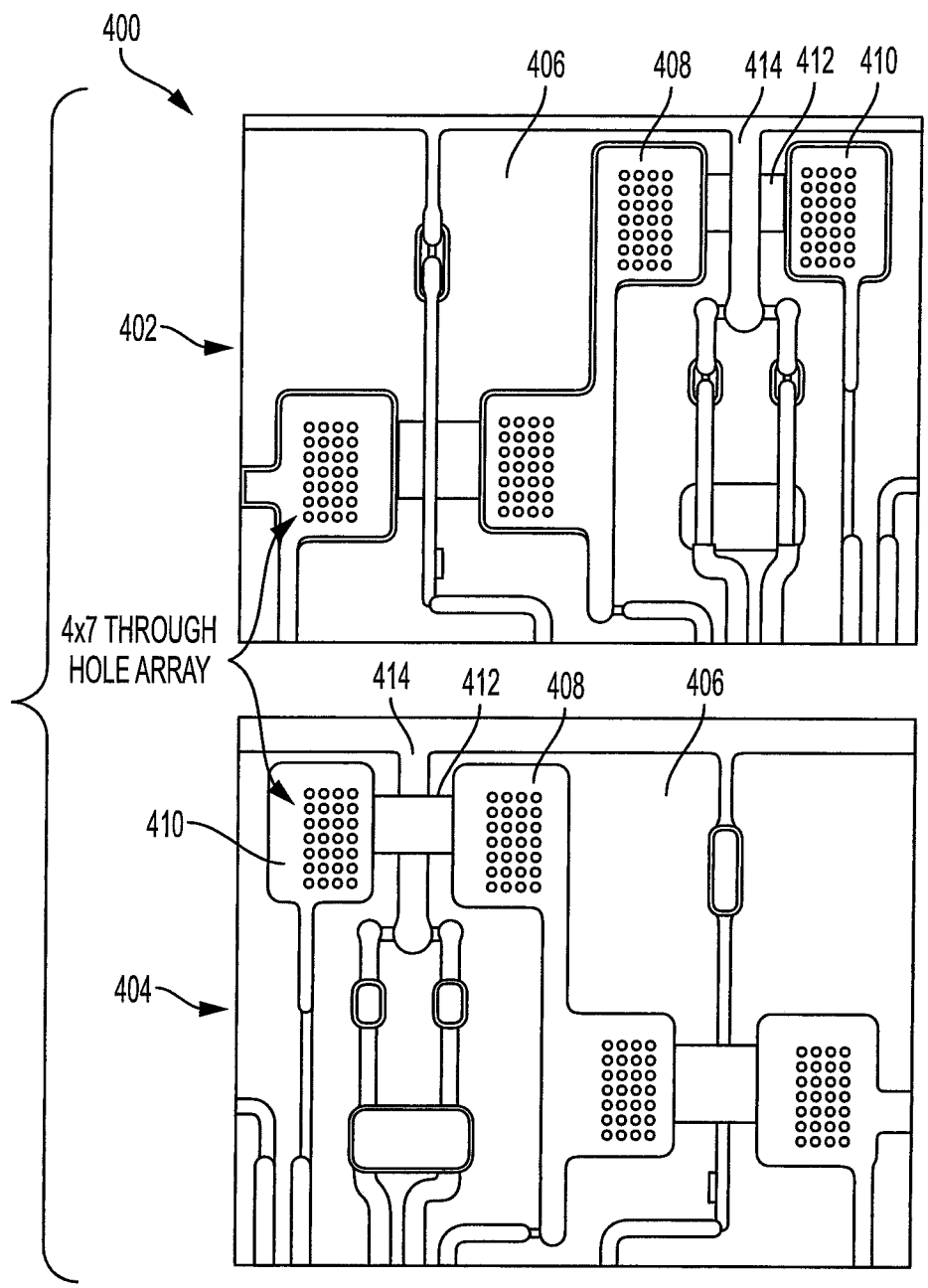
FIG. 4 shows the back side and the front side of a printed circuit with a crossover structure.

Turning to FIG. 4, illustrated is a portion of a printed circuit arrangement 400 having a first or back side 402 and a second or front side 404. The printed circuit arrangement 400 is configured on a transparent substrate 406. Printed circuit arrangement 400 implements the crossover structure (or bypass connection) according to the present application. During circuit fabrication arrays of through holes are designed in accordance with the previous teachings. To be particularly discussed are through hole arrays 408 and 410 (e.g., first and second common electrical connecting areas), which are each 4-by-7 through hole arrays having the same diameter (i.e., 100 microns). The through holes are formed by laser drilling of other cutting means, such as shown in connection with FIG. 2A. With this array design, printing is performed on the two-sided circuit board substrate 406. For example, when the conductive material (such as shown in FIGS. 2A and 2B) is printed over and into the through holes of arrays 408 and 410, the through holes are provided with conductive material (e.g., Ag, nanoparticle extruded ink, etc.) into their interiors, where a shallow gap (open area) is left on the opposite side surface of the substrate 406. The printed material is then dried or cured a required amount. Subsequently, a similar process is undertaken on the opposite surface side of the substrate 406 in order to provide a full conductive connection from the first surface 402 through to the second surface 404. A portion of a conductive trace (e.g., a portion of a particular one of a plurality of electrical conductors) acting as a crossover structure 412 is printed between arrays 408 and 410. Viewing from the backside 402, the crossover structure 412 is shown behind a conductive element 414. Whereas viewing from front side 404 the crossover structure 412 is facing to the viewer and is shown above the conductive element 414. As mentioned previously, the full conductive path is formed when both sides have been printed and the conductive materials merge (e.g., 210 and 220 of FIGS. 2A and 2B).

In an embodiment discussed herein the pitch or distance between the holes has been determined to be useful to be double the diameter of the through holes. Under this teaching where there is a 200 (100) micron through hole, there is an approximately 400 (220) micron pitch (i.e., distance between holes).

It is also noted there is a relationship between the diameter of the through holes and the thickness of the substrate. So a 150 micrometer substrate will have a particular diameter when used with a particular conductive material. If the substrate thickness is less, there is a possibility of using through holes of a smaller diameter.

It is also mentioned that at a certain open height level ("h"), gas bubbles can form between the conductive material (e.g., 210, 220) and may prevent a connection between the first printed conductive material and the second printed conductive material. In some embodiments, that upper level ("h") is approximately in the range of 55 micron to 65 microns, and more particularly approximately 60 microns. Therefore depending on the particular implementation there is an upper limit to the open area.

Figure 5A:
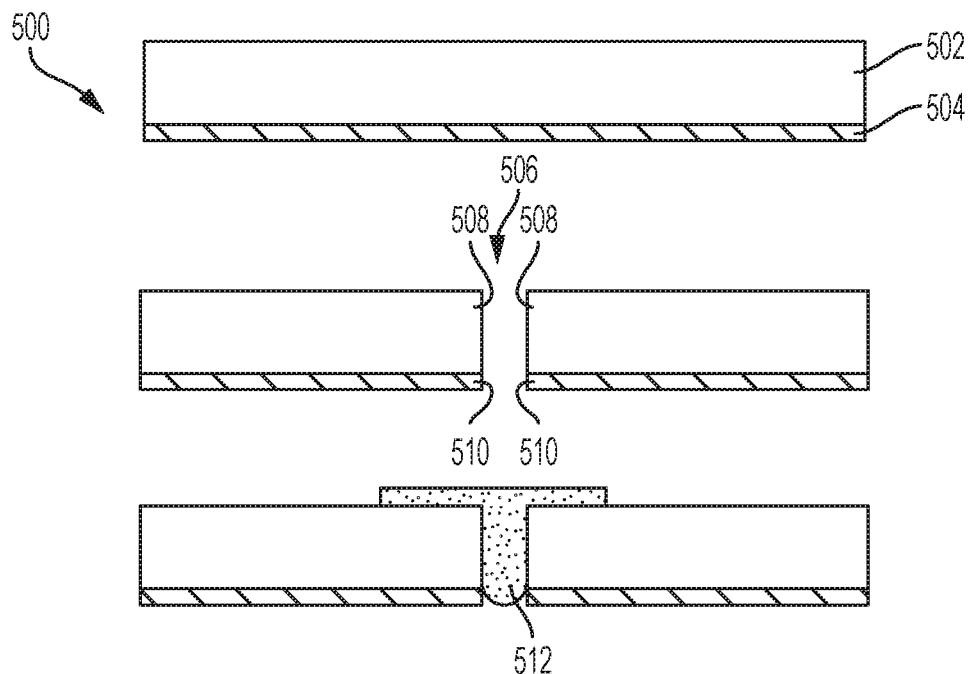
FIG. 5A shows another embodiment for forming the conductive through holes of the present application.
Figure 5B:
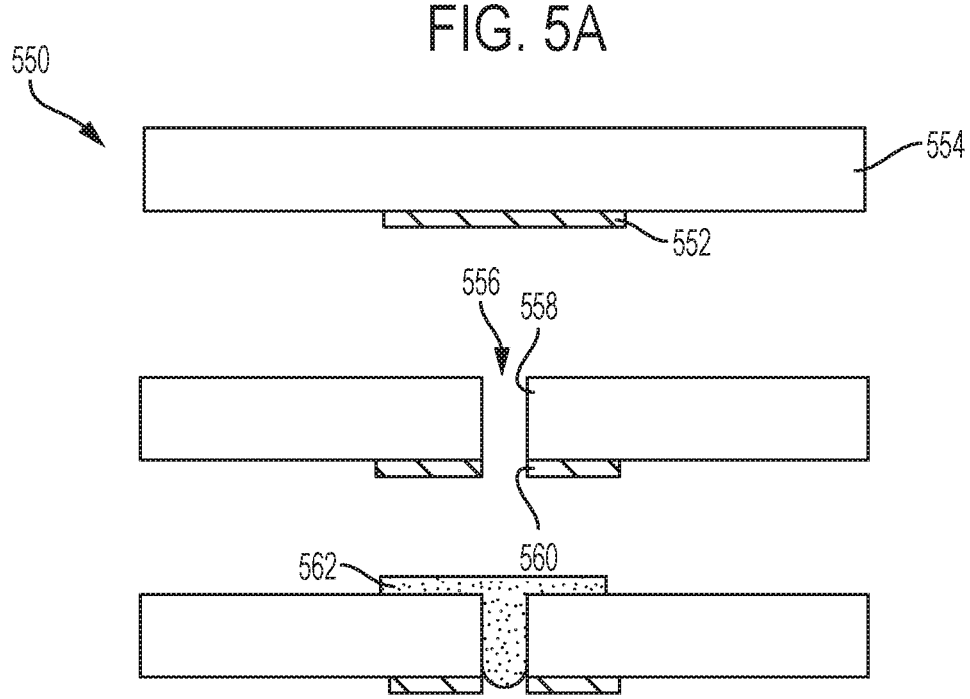
FIG. 5B shows another embodiment for forming the conductive through holes of the present application.

While the foregoing embodiments illustrated the process where the conductive material is printed from one of the surfaces of the printed circuit board substrate such that it enters partially into the through holes, and thereafter the conductive material is printed on the other surface so the conductive material entering through the other surface of the through holes will meet with the first printed conductive material, thereby generating a fully conductive through hole connection, the following FIGS. 5A and 5B illustrate alternative embodiments.

In particular, as shown in FIG. 5A, arranged is a process 500, wherein provided is hydrophilic (ink-philic) substrate 502, and a hydrophobic (ink-phobic) area or layer 504. A laser drill or other cutting means (such as shown in FIG. 2A) forms a through hole (e.g., for convenience of explanation only one through hole of the array of through holes is shown) 506 in both the hydrophilic substrate 502 and the hydrophobic layer 504. This creates a through hole 506 which includes a hydrophilic interior surface portion 508 and a hydrophobic interior portion 510. Then when conductive material 512 is printed into the through hole 506, the conductive material 512 moves through the hydrophilic substrate 502 via capillary action, but then is stopped at the hydrophobic layer 504. This design provides the hydrophobic layer to be sufficiently thin such that it is not necessary to then print on the opposite side to fill any remaining area of the through hole, but rather the printing of the crossover structure is sufficient to form a complete conductive path, although if desired or needed in certain instances, a second printing can be undertaken on the opposite side of the substrate.

Additionally in certain embodiments the hydrophobic layer 504 is designed to be removed from the hydrophilic substrate 502 whereby the conductive material 512 is at the substrate surface and a complete conductive path is achieved.

Turning to FIG. 5B, illustrated is a similar process 550 as shown in FIG. 5A. However, in this embodiment, instead of a hydrophobic layer, areas are formed by a number of hydrophobic printed dots or portions 552 (only a single dot or portion is shown for discussion) formed on a hydrophilic substrate 554. Then again, via laser cutting or other appropriate cutting device, through hole 556 is formed having the hydrophilic interior surface 558 and the hydrophobic interior surface 560. And similar to the previous discussion, once the conductive material 562 is printed, it will also move through the hydrophilic substrate 554 until it is stopped by the hydrophobic dots 552. Similar to FIG. 5A the dots 552 may in certain embodiments be made removable from the hydrophilic substrate 554.

Figure 6:
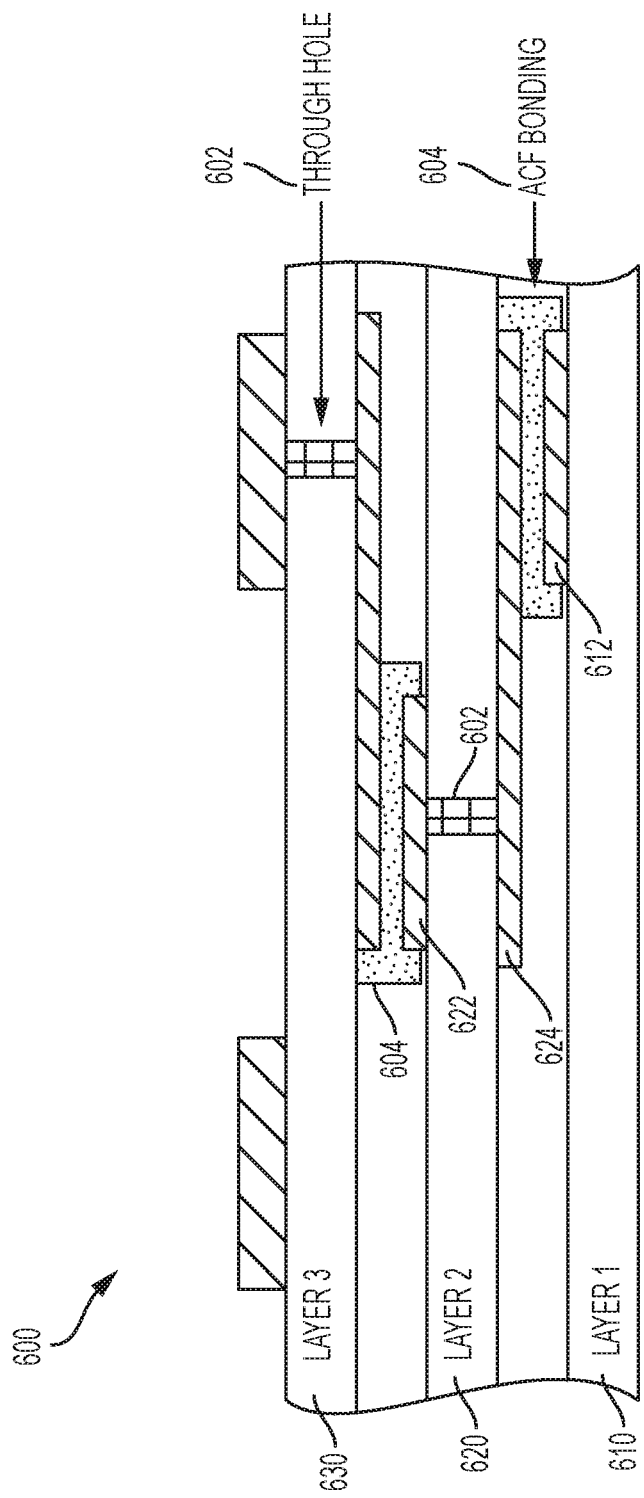
FIG. 6 illustrates a multi-layer circuit board configured in accordance with the present application.

Turning to FIG. 6, illustrated is a multi-layered circuit board 600. It is understood that the crossover structures and method of making the crossover structures may be used to form flexible multi-layer interconnects for the multi-layered circuit board 600. As shown in FIG. 6, there are 3 layers, 610, 620, and 630. Each of these layers has conductive patterns on both side of the substrate. For example, layer 2 620 can be constructed by forming a conductive pattern with a conductive pad 622 on one surface and another conductive pattern with a contact pad 624 on the other surface of the substrate of 620. Contact pads 622 and 624 are connected through the substrate via front-to-back interconnects 602 with foregoing embodiments. The contact pad of one layer (e.g. 624) can be connected to a pad on another layer (e.g. pad 612 on layer 610) by applying anisotropic conductive film (ACF) layer-to-layer connections 604. By this process the multi-layer flexible PCB circuit 600 is formed in this embodiment. It is noted that the back-to-back interconnects 602 are intended to represent through hole arrays such as previously described.

Figure 7:
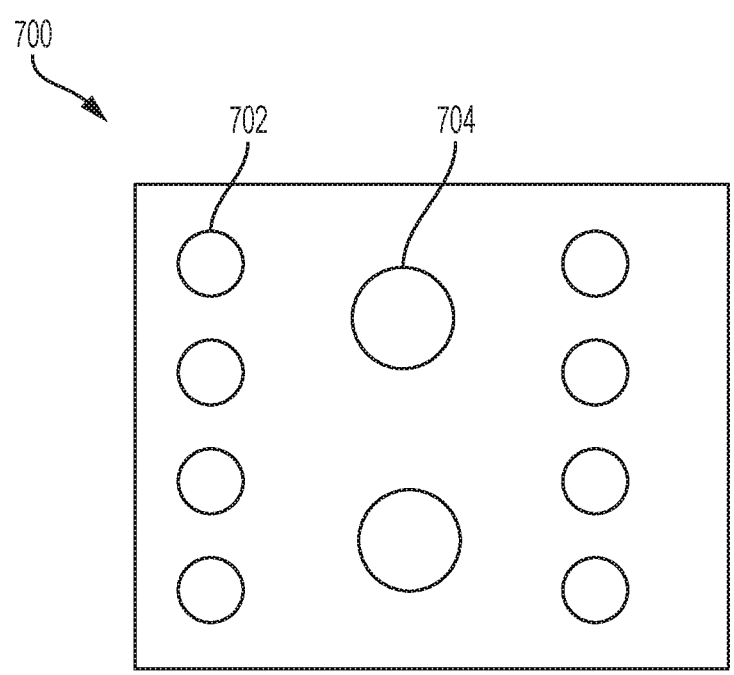
FIG. 7 illustrates alternative embodiments for through hole arrays.

Turning to FIG. 7, while previous embodiments showed all of the through holes of a particular array having the same through hole diameter, in alternative embodiments a single through hole array 700 may have different sized through holes 702, 704. This allows for additional flexibility in design. In embodiments of this type, it is understood the open area within the through holes may have differing heights and this would need to be taken into account during the printing process.

Also while all of the through holes of a particular array are commonly filled with the same conductive material, in alternative embodiments some of the through holes of an array may be filled with a conductive material having characteristics distinct from other through holes of the array. In still other embodiments certain ones of the through holes may be left empty or may be filled with a non-conductive material. These embodiments provide a range of conductivity for a single array type.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. An integrated circuit comprising:
    a two sided circuit board, having a first surface and a second surface;
    a plurality of electrical conductors being incorporated as part of the two sided circuit board;
    at least four distinct through hole arrays, each of the four distinct through hole arrays including a plurality of individual through holes which extend through the first surface and the second surface, arranged in a pattern and configured to provide a common electrical connection area for each of the four distinct through hole arrays,
    wherein the common electrical connection area of each of the at least four distinct through hole arrays are each associated with a distinct portion of particular ones of the plurality of electrical conductors.

2. The integrated circuit of claim 1 wherein the particular ones of the plurality of electrical conductors are crossover structures with which selected ones of the at least four distinct through hole arrays form a common electrical path, and wherein the crossover structures are located on a side of the two sided circuit board opposite some of the plurality of electrical conductor arrays as conductive traces on the two sided circuit board that is desired to avoid being shorted by the crossover structures.

3. The integrated circuit of claim 2 wherein at least one of the through holes of at least one of the at least four distinct through hole arrays is of a diameter different than other through holes of the at least four distinct through hole arrays.

4. The integrated circuit of claim 1 wherein the at least four distinct through hole arrays are filled with a conductive material.

5. The integrated circuit of claim 1 wherein the through holes of the at least four distinct through hole arrays are of a same diameter and positioned in an arrangement of at least three rows by three columns.

6. The integrated circuit of claim 5 wherein a distance between the through holes of the at least four distinct through hole arrays are substantially double the diameter of the through holes.

7. The integrated circuit of claim 1 wherein the two sided circuit board includes a hydrophilic substrate and a hydrophobic area located on one of the first surface and the second surface of the two-sided circuit board.

8. The integrated circuit of claim 7 wherein the hydrophobic area is one of a hydrophobic layer and a plurality of hydrophobic dots corresponding to the through holes.

9. An integrated circuit comprising:
    a two sided circuit board having a first surface and a second surface;
    a plurality of electrical conductors incorporated as part of the two sided circuit board;
    a first array of through holes of at least four distinct through hole arrays, each of the distinct through hole arrays including a plurality of individual through holes, which extend through the first surface and the second surface, the first array of through holes arranged in a pattern and configured to provide a first common electrical connection area;
    a second array of through holes of the at least four distinct through hole arrays, each of the distinct through hole arrays including a plurality of individual through holes, which extend through the first surface and the second surface, the second array of through holes arranged in a pattern and configured to provide a second common electrical connection area; and
    a crossover structure, being one of the plurality of electrical conductors, electrically connected to the first array of through holes and the second array of through holes, on one of the first surface and the second surface of the circuit board, wherein the first array of through holes, and the second array of through holes provide for an electrically conductive path for the crossover structure, wherein the crossover structure is located on a side of the two sided circuit board opposite a conductive trace of the two sided circuit board that is desired to avoid being shorted by the crossover structure, wherein the conductive trace is one of the plurality of electrical conductors other than the crossover structure.

10. The integrated circuit of claim 9 wherein the first and second array of through holes are filled with a conductive material.

11. The integrated circuit of claim 9 wherein the through holes of the first and the second array of through holes are each of a same diameter and positioned in an arrangement of at least three rows by three columns.

12. The integrated circuit of claim 11 wherein the distance between the through holes of the first and second array of through holes is substantially double the diameter of the through holes.

13. The integrated circuit of claim 9 wherein the through holes of the first and second array are filled with a conductive material from the first surface and the second surface.

14. The integrated circuit of claim 9 wherein the two sided circuit board includes a hydrophilic substrate and a hydrophobic area located on one of the first surface and the second surface of the two-sided circuit board.

15. The integrated circuit of claim 14 wherein the hydrophobic area is one of a hydrophobic layer and at least one hydrophobic dot corresponding to the through holes.

16. A method of configuring a two sided circuit board having a first surface and a second surface, the method comprising:
    generating a first array of through holes of at least four distinct through hole arrays, each of the distinct through hole arrays including a plurality of individual through holes, which extend through the first surface and the second surface, arranged in a pattern and configured to provide a first common electrical connection area;
    generating a second array of through holes of the at least four distinct through hole arrays, each of the distinct through hole arrays including a plurality of individual through holes, which extend through the first surface and the second surface, arranged in a pattern and configured to provide a second common electrical connection area;
    incorporating a conductive material into the first array of through holes and the second array of through holes sufficient to provide conductive paths within the through holes from the first surface to the second surface;
    wherein the first and second common electrical connection areas are associated with an electrical conductor acting as a crossover structure, wherein the crossover structure, the first array of through holes, and the second array of through holes form a common electrical path, wherein the crossover structure is located on a side of the two sided circuit board opposite a conductive trace of the two sided circuit board that is desired to avoid being shorted.

17. The method according to claim 16 further including filling the through holes of the first and second array with a conductive material from the first surface and the second surface.

18. The method according to claim 16 further including providing the two sided circuit board with a hydrophilic substrate and a hydrophobic area located on one of the first surface and the second surface of the two-sided circuit board.

19. The method according to claim 18 wherein the hydrophobic area is one of a hydrophobic layer and at least one hydrophobic dots corresponding to the through holes.

* * * * *